United States Patent
Hsu et al.

(10) Patent No.: US 7,413,939 B2
(45) Date of Patent: Aug. 19, 2008

(54) METHOD OF GROWING A GERMANIUM EPITAXIAL FILM ON INSULATOR FOR USE IN FABRICATION OF CMOS INTEGRATED CIRCUIT

(75) Inventors: Sheng Teng Hsu, Camas, WA (US); Jong-Jan Lee, Camas, WA (US); Jer-Shen Maa, Vancouver, WA (US); Douglas J. Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 352 days.

(21) Appl. No.: 11/149,891

(22) Filed: Jun. 10, 2005

(65) Prior Publication Data

US 2006/0281232 A1 Dec. 14, 2006

(51) Int. Cl.
*H01L 21/00* (2006.01)
*H01L 21/84* (2006.01)

(52) U.S. Cl. .......... 438/154; 438/166; 438/489; 257/E21.133; 257/E21.572; 257/E21.632

(58) Field of Classification Search .......... 438/149, 438/154, 157, 166, 488, 489, 490, 478, 933; 257/E21.133, E21.572, E21.632
See application file for complete search history.

(56) References Cited

U.S. PATENT DOCUMENTS

| | | | | |
|---|---|---|---|---|
| 4,707,217 A | * | 11/1987 | Aklufi | 117/44 |
| 4,812,890 A | * | 3/1989 | Feygenson | 257/74 |
| 6,403,981 B1 | * | 6/2002 | Yu | 257/63 |
| 6,528,399 B1 | * | 3/2003 | Alieu et al. | 438/561 |
| 6,635,110 B1 | * | 10/2003 | Luan et al. | 117/4 |
| 7,008,813 B1 | * | 3/2006 | Lee et al. | 438/56 |
| 7,019,079 B2 | * | 3/2006 | Sumi et al. | 525/199 |
| 7,094,671 B2 | * | 8/2006 | Li | 438/520 |
| 2007/0087507 A1 | * | 4/2007 | Liu et al. | 438/266 |

OTHER PUBLICATIONS

Liu et al., *High quality single-crystal Ge on insulator by liquid-phase epitaxy on Si substrate*, Applied Physics Letters, vol. 84, No. 14, pp. 2563-2565 (2004).

* cited by examiner

*Primary Examiner*—Michael Lebentritt
*Assistant Examiner*—Stanetta Isaac

(57) ABSTRACT

A method of fabricating a silicon-germanium CMOS includes preparing a silicon substrate wafer; depositing an insulating layer on the silicon substrate wafer; patterning and etching the insulating layer; depositing a layer of polycrystalline germanium on the insulating layer and on at least a portion of the silicon substrate wafer; patterning and etching the polycrystalline germanium; encapsulating the polycrystalline germanium with an insulating material; rapidly thermally annealing the wafer at a temperature sufficient to melt the polycrystalline germanium; cooling the wafer to promote liquid phase epitaxy of the polycrystalline germanium, thereby forming a single crystal germanium layer; and completing the CMOS device.

12 Claims, 3 Drawing Sheets

METHOD OF GROWING A GERMANIUM EPITAXIAL FILM ON INSULATOR FOR USE IN FABRICATION OF CMOS INTEGRATED CIRCUIT

FIELD OF THE INVENTION

This invention relates to high speed integrated circuits, and specifically to a CMOS having germanium-on-insulator and silicon-on-insulator components.

BACKGROUND OF THE INVENTION

Prior art high-speed integrated circuits are formed by shrinking the device size to shorten the carrier transit time, and using strained silicon to increase carrier mobility. Both processes require short-channel devices and complicated fabrication processes.

The electron and hole mobility of germanium is about three times higher than that of silicon, therefore, the speed of a germanium CMOS is expected to be at least two times greater than that of the same generation of silicon CMOS integrated circuit. For germanium-on-insulator (GOI) technology, the speed is expected to increase at least two times that of silicon-on-insulator (SOI). Very high performance system-on-chip (SOC) integrated circuits may be fabricated using GOI CMOS for the high speed portion of the SOC and SOI CMOS for the lower speed portion of the integrated circuit. SOC chip performance may be substantially greater than a state-of-the art silicon integrated SOC using the same generation of integrated circuit fabrication process.

Liu et al., *High quality single-crystal Ge on insulator by liquid-phase epitaxy on Si substrate*, Applied Physics Letters, vol. 84, no. 14, pp 2563-2565, describes fabrication of a germanium-on-insulator device wherein germanium crystal orientation is controlled by forming a seed layer on the silicon substrate.

SUMMARY OF THE INVENTION

A method of fabricating a silicon/germanium CMOS includes preparing a silicon substrate wafer; depositing an insulating layer on the silicon substrate wafer; patterning and etching the insulating layer; depositing a layer of polycrystalline germanium on the insulating layer and on at least a portion of the silicon substrate; patterning and etching the polycrystalline germanium; encapsulating the polycrystalline germanium with an insulating material; rapidly thermally annealing the wafer at a temperature sufficient to melt the polycrystalline germanium; cooling the wafer to promote liquid phase epitaxy (LPE) of the polycrystalline germanium, thereby forming a single crystal germanium layer; and completing the CMOS device.

It is an object of the invention to provide a method of fabricating a CMOS incorporating both SOI and GOI portions.

It is an object of the invention to provide a speed more than two generations faster than that of the prior art device structure.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The device structure of the method of the invention provides a speed of more than two generations greater than that of a prior art device structure. This invention provides a method of growing a germanium epitaxial film on insulator on a silicon substrate for fabrication of a germanium CMOS on a silicon CMOS integrated circuit substrate, thereby forming a germanium-on-insulator (GOI) CMOS on bulk silicon CMOS hybrid integrated circuit. This technology is particularly suitable for high speed system-on-chip (SOC) circuit fabrication wherein a germanium CMOS is provided for a high speed portion of the system, while the lower speed portion of the system is fabricated using conventional bulk silicon technology.

Figure 1:
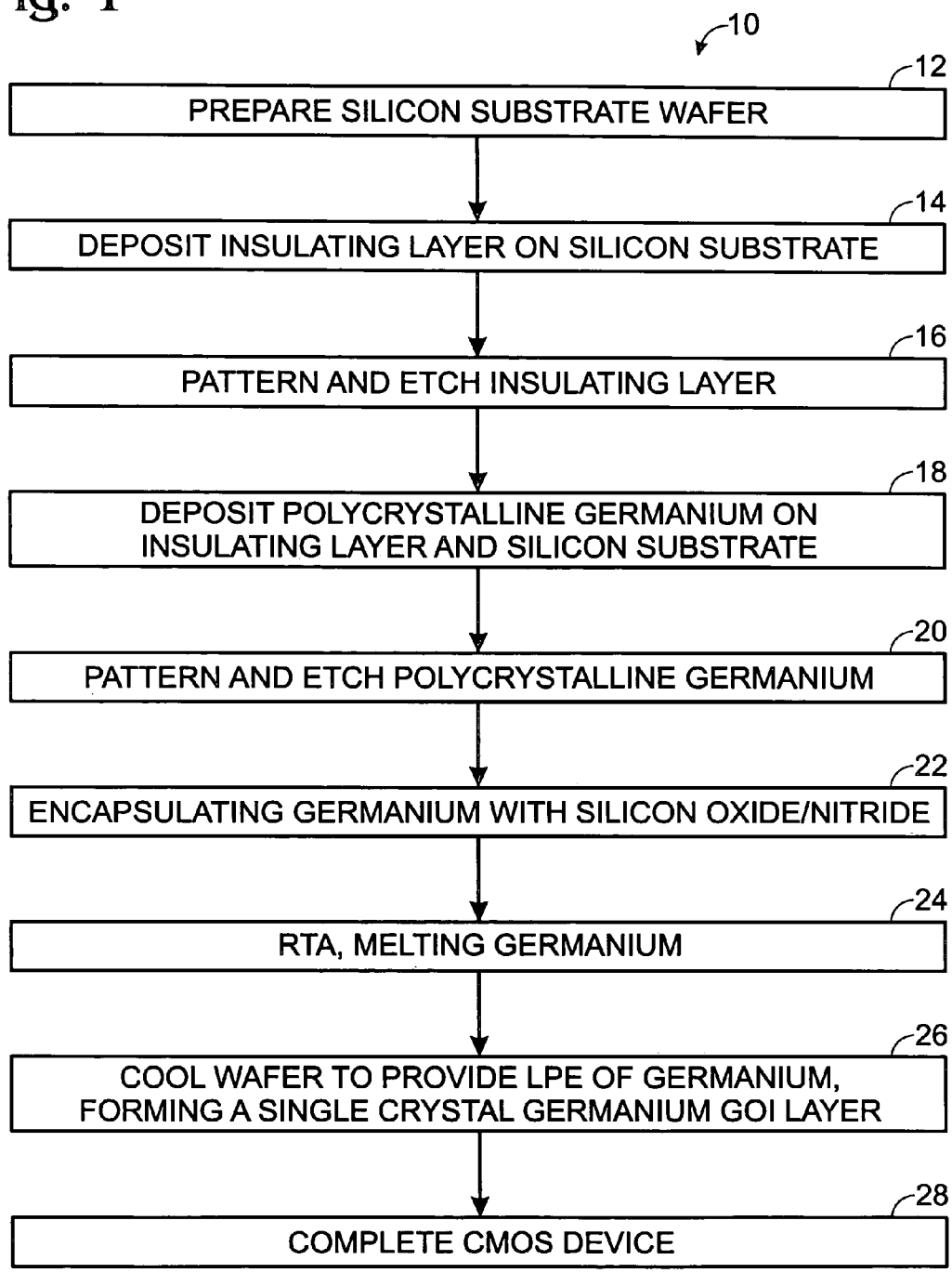
FIG. 1 is a block diagram of the method of the invention.

Referring to FIG. 1, the method of the invention is depicted generally at 10, and includes preparing 12 a silicon wafer, using conventional fabrication techniques. A thin silicon nitride layer is deposited 14 onto the silicon wafer to a thickness of between about 10 nm to 500 nm, and may be replaced by other insulator layers. The silicon nitride is patterned and etched, 16. A layer of polycrystalline germanium is then non-selectively deposited 18 to a thickness of between about 5 nm to 100 nm. The germanium deposition method may be CVD (chemical vapor deposition), PVD (physical vapor deposition), MBE (Molecule Beam Epitaxy), or any other suitable thin film deposition methods.

The germanium film is patterned and etched into desired features 20. These features must include a small area wherein the germanium film is located directly on top of the silicon substrate, which area acts as a seed for a subsequent germanium epitaxial process.

A conformal silicon oxide dielectric layer having a thickness of between about 10 nm to 100 nm is deposited to encapsulate the germanium film, 22. Rapid thermal annealing (RTA) 24 is used to heat the silicon substrate wafer and the germanium film to between about 920° C. to 1000° C. The melting temperature for crystalline germanium is 937° C. During this heat treatment, the germanium film melts, and the SiN and $SiO_2$ films act as micro-crucibles, preventing the germanium liquid from flowing, while the silicon substrate, $SiO_2$ and SiN remain solid. Thus, the temperature range of between about 920° C. to 1000° C. is critical to the practice of the method of the invention. The wafer is then cooled. During the cooling process, liquid phase epitaxial (LPE) growth of germanium occurs 26, wherein the growth front begins at the Si/Ge interface in the seeding windows, i.e., next to the silicon substrate, propagating laterally through the germanium thin film. Finally, single crystalline germanium is formed, with the defects therein being concentrated and terminated at the seeding window. This completes GOI formation process. This process provides the base material for germanium CMOS on insulator thin film device fabrication. The CMOS structure is then completed 28.

Figure 2:
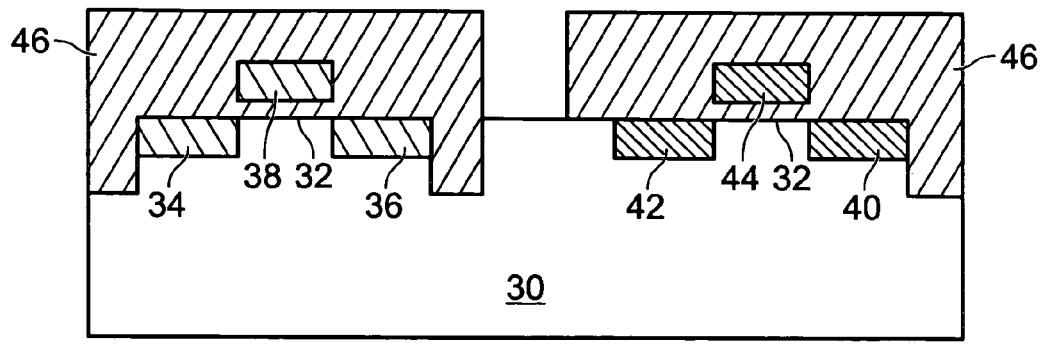
FIGS. 2-5 depict various stages in fabrication of a semiconductor device according to the method of the invention.

The germanium-silicon CMOS may be fabricated as follows, and now referring to FIG. 2, state-of-the-art bulk CMOS fabrication processes are followed to complete the front end bulk CMOS fabrication, including preparation 12 of the silicon substrate 30, which includes fabrication of a silicon-based CMOS, including deposition of a gate oxide, 32, formation of N+ source 34, drain 36 and gate electrode 38, and formation of P+ source 40, drain 42 and gate electrode 44.

A passivation oxide layer 46 is deposited and CMP polished to planarize the wafer surface. Photoresist is applied and the oxide patterned and etched, followed by ion implantation, to produce the structure depicted in FIG. 2.

Figure 3:
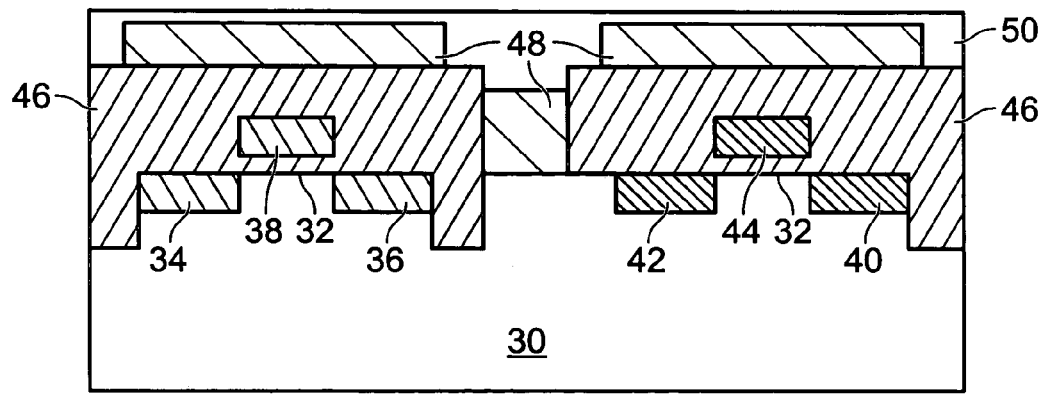

Referring to FIG. 3, formation of a germanium-based CMOS on the silicon-based CMOS includes deposition of a layer of germanium 48 having a thickness of between about 5 nm to 100 nm, which is covered with between about 10 nm to 100 nm of an insulating layer 50, which may be SiN or $SiO_2$, to encapsulate germanium layer 48. The wafer is placed in an RTA furnace 24, and heated to a temperature of between about 920° C. to 1000° C. The wafer is then cooled. During the cooling process, liquid phase epitaxial (LPE) growth of germanium 26. Insulating layer 50 is etched, as is now single-crystal germanium layer 48. An optional mask may be used to etch the germanium film in the seed area to isolate the GOI, which may be preferred at this state of wafer fabrication. It is not necessary completely to remove all of the germanium in the seed area, 52.

Figure 4:
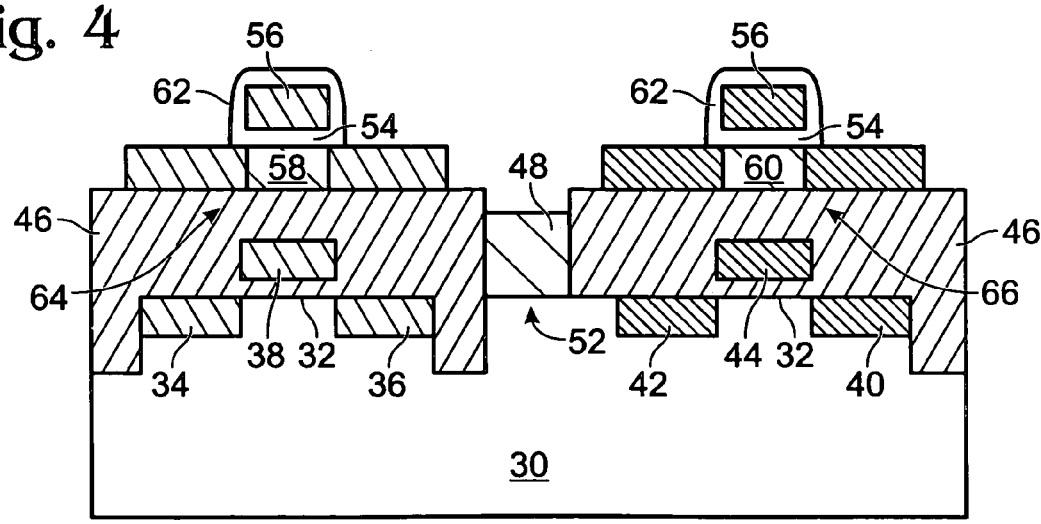

A high-k gate insulator 54, such as $HfO_2$, $ZrO_2$, etc., is deposited, followed by deposition of polycrystalline germanium or polycrystalline silicon. Photoresist is applied, patterned and the polycrystalline germanium, or polycrystalline silicon, is etched 20 to form high-speed CMOS gate electrodes 56. Ion implantation forms a n-LDD region 58 and a p-LDD region 60 in the germanium CMOS. A gate sidewall oxide/nitride 62 is formed. Another ion implantation step forms P+ source/drain regions 64 and N+ source/drain regions 66. Prior to source/drain ion implantation, an optional step of selective silicon epitaxial growth at the source/drain region may be preferred to reduce the source/drain parasitic, resistance to enhance the device performance, resulting in the structure shown in FIG. 4.

Figure 5:
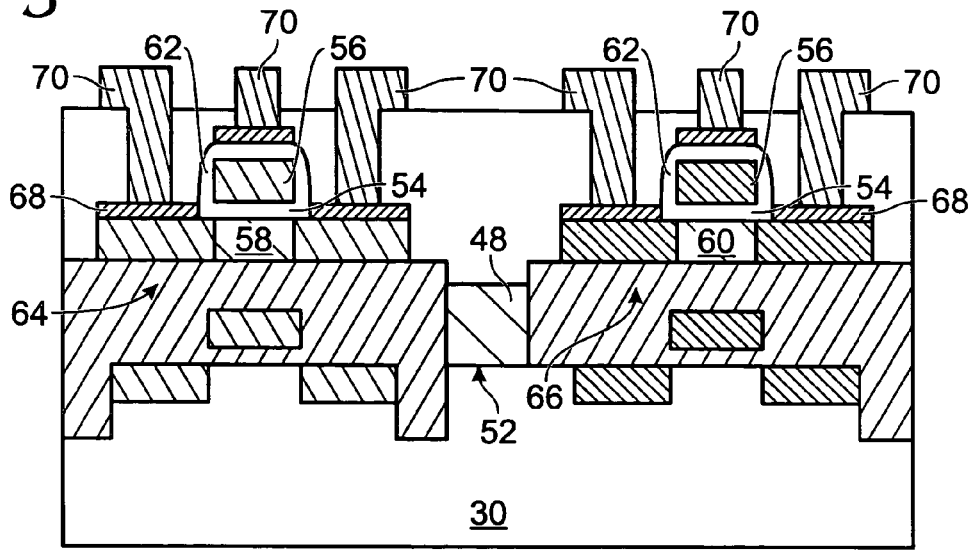

Referring now to FIG. 5, an optional step of source/drain and gate salicidation may be performed, forming salicide layer 68 on the source/drain regions and gate electrode and metal contact. Passivation oxide is deposited, followed by metallization to form metal contacts 70, as is sketched in FIG. 5, wherein the metal lines of bulk CMOS are not shown for the sake of simplicity. The metallization of the silicon bulk CMOS may be completed or partially completed before the fabrication of GOI CMOS, however, the aspect ratio of the germanium seed via may be so large that the germanium thin film may not be able to fill the via. In this case, a selective silicon epitaxial process may be needed partially to fill the germanium seed via before deposition of the germanium thin film.

Figure 6:
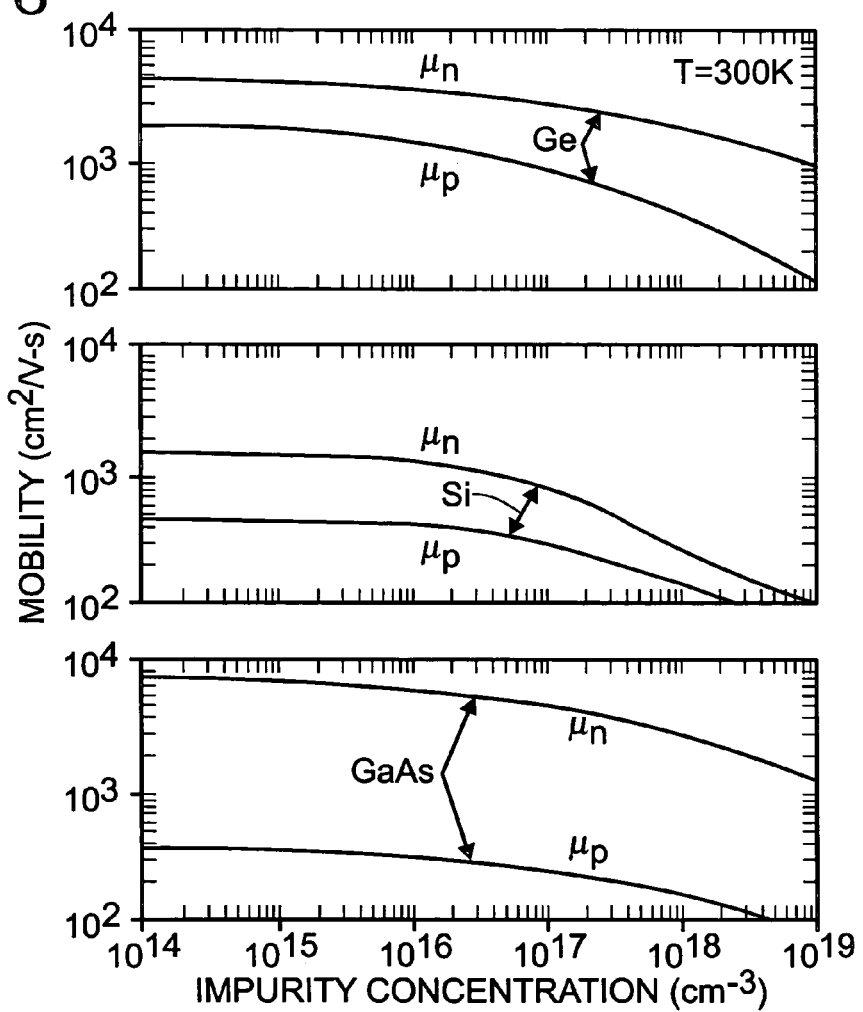
FIG. 6 depicts electron and hole mobility as a function of doping density for germanium, silicon and gallium arsenide.

FIG. 6 presents the electrons and holes mobility as a function of doping density for germanium, silicon, and gallium arsenide, respectively. As is shown in this figure the electron and hole mobility of Ge is more than three times higher than those of silicon.

Thus, a method for fabricating a CMOS device having both GOI and SOI components has been disclosed. It will be appreciated that further variations and modifications thereof may be made within the scope of the invention as defined in the appended claims.

We claim:

1. A method of fabricating a silicon-germanium CMOS comprising:
   preparing a silicon substrate wafer;
   depositing an insulating layer on the silicon substrate wafer;
   patterning and etching the insulating layer;
   depositing a layer of polycrystalline germanium on the insulating layer and on at least a portion of the silicon substrate wafer to form a silicon/germanium interface;
   patterning and etching the polycrystalline germanium;
   encapsulating the polycrystalline germanium with an insulating layer;
   rapidly thermally annealing the wafer at a temperature sufficient to melt the polycrystalline germanium;
   cooling the wafer to promote liquid phase epitaxy of the polycrystalline germanium beginning at the silicon/germanium interface and extending laterally therefrom, thereby forming a single crystal germanium layer; and
   completing the CMOS device.

2. The method of claim 1 wherein said preparing a silicon substrate wafer includes forming a silicon-based CMOS on the silicon substrate wafer.

3. The method of claim 1 wherein said depositing a layer of polycrystalline germanium includes depositing a layer of polycrystalline germanium to a thickness of between about 5 nm to 100 nm.

4. The method of claim 1 wherein said rapidly thermally annealing the wafer includes heating the wafer to a temperature of between about 920° C. to 1000° C.

5. The method of claim 1 wherein said completing the CMOS includes source/drain and gate salicidation of a germanium-based CMOS device.

6. A method of fabricating a silicon-germanium CMOS comprising:
   preparing a silicon substrate wafer, including forming a silicon-based CMOS thereon;
   forming a germanium-based CMOS on the silicon-based CMOS, including depositing an insulating layer on the silicon substrate wafer;
   patterning and etching the insulating layer;
   depositing a layer of polycrystalline germanium on the insulating layer and on at least a portion of the silicon substrate wafer to form a silicon/germanium interface;
   patterning and etching the polycrystalline germanium;
   encapsulating the polycrystalline germanium with an insulating layer;
   rapidly thermally annealing the wafer at a temperature sufficient to melt the polycrystalline germanium;
   cooling the wafer to promote liquid phase epitaxy of the polycrystalline germanium beginning at the silicon/germanium interface and extending laterally therefrom, thereby forming a single crystal germanium layer; and
   completing the germanium-based CMOS device.

7. The method of claim 6 wherein said depositing a layer of polycrystalline germanium includes depositing a layer of polycrystalline germanium to a thickness of between about 5 nm to 100 nm.

8. The method of claim 6 wherein said rapidly thermally annealing the wafer includes heating the wafer to a temperature of between about 920° C. to 1000° C.

9. The method of claim 6 wherein said completing the CMOS includes source/drain and gate salicidation of the germanium-based CMOS device.

10. A method of fabricating a silicon-germanium CMOS comprising:
    preparing a silicon substrate wafer;
    depositing an insulating layer on the silicon substrate wafer;
    patterning and etching the insulating layer;
    depositing a layer of polycrystalline germanium, to a thickness of between about 5 nm to 100 nm, on the insulating layer and on at least a portion of the silicon substrate wafer to form a silicon/germanium interface;
    patterning and etching the polycrystalline germanium;
    encapsulating the polycrystalline germanium with an insulating layer;
    rapidly thermally annealing the wafer at a temperature a temperature of between about 920° C. to 1000° C. to melt the polycrystalline germanium while not melting the silicon substrate wafer and the insulating layer;

cooling the wafer to promote liquid phase epitaxy of the polycrystalline germanium beginning at the silicon/germanium interface and extending laterally therefrom, thereby forming a single crystal germanium layer; and completing the CMOS device.

11. The method of claim 10 wherein said preparing a silicon substrate wafer includes forming a silicon-based CMOS on the silicon substrate wafer.

12. The method of claim 10 wherein said completing the CMOS includes source/drain and gate salicidation of a germanium-based CMOS device.

* * * * *